United States Patent [19]

Brown et al.

[11] 3,991,269
[45] Nov. 9, 1976

[54] DIGITAL CODING WITHOUT ADDITIONAL BITS TO PROVIDE SIGN INFORMATION

[75] Inventors: Earl Franklin Brown, Piscataway; John Francis Moran, Holmdel, both of N.J.

[73] Assignee: Bell Telephone Laboratories, Incorporated, Murray Hill, N.J.

[22] Filed: Sept. 18, 1975

[21] Appl. No.: 614,435

[52] U.S. Cl. ............................... 178/68; 325/38 B; 340/347 AD; 179/15 AV; 332/11 D
[51] Int. Cl.² ........................................ H03K 13/22
[58] Field of Search ........... 178/68, DIG. 3; 325/38, 325/38 A, 38 B; 340/347 AD, 347 DA; 179/15 AV, 15 AE; 332/11 R, 11 D

[56] References Cited
UNITED STATES PATENTS

| | | | |
|---|---|---|---|
| 3,593,141 | 7/1971 | Brown et al. | 325/38 |
| 3,689,840 | 9/1972 | Brown et al. | 325/38 B |
| 3,716,789 | 2/1973 | Brown et al. | 325/38 A |
| 3,800,225 | 3/1974 | Meares | 332/11 D |
| 3,825,832 | 7/1974 | Frei et al. | 325/38 B |
| 3,831,092 | 8/1974 | Greefkes | 178/68 |

*Primary Examiner*—Robert L. Griffin
*Assistant Examiner*—Michael A. Masinick
*Attorney, Agent, or Firm*—John Francis Moran

[57] ABSTRACT

A pulse code modulator utilizes a predetermined bit, which is the least significant bit in each code group, to indicate the polarity of the signal amplitude sample whose magnitude is represented by the immediately succeeding code group. Since variations in magnitude change the value of the predetermined bit in a more or less random fashion and the same is true of the polarity of the samples to be encoded, in the course of the encoding process there is a relatively high probability of occasions when the magnitude and polarity will call for the same value of bit. When there is a disagreement in bit value for the magnitude and polarity, the predetermined bit in each code group is forced to indicate the correct polarity. Additional bits in each of these code groups may also be changed to provide the most accurate magnitude information with the corrected polarity information.

6 Claims, 2 Drawing Figures

FIG. 2

| CODE GROUPS | QUANTIZING LEVELS | FOURTH BIT (LEVEL) |
|---|---|---|
| 000 | 1 | 0 / 1 — (1.5) |
| 001 | 2 | 0 / 1 — (2.5) |
| 010 | 3 | 0 / 1 — (4.5) |
| 011 | 6 | 0 / 1 — (7.5) |
| 100 | 9 | 0 / 1 — (11.5) |
| 101 | 14 | 0 / 1 — (18.5) |
| 110 | 23 | 0 / 1 — (27.5) |
| 111 | 32 | |

DIGITAL CODING WITHOUT ADDITIONAL BITS TO PROVIDE SIGN INFORMATION

BACKGROUND OF THE INVENTION

This invention relates to the encoding of an analog signal into digital bits and, more particularly, to the type of encoding commonly known as pulse code modulaion (PCM).

A limited capacity of existing digital transmission systems coupled with an ever-increasing demand for transmitting informaion has given rise to several encoding techniques for decreasing the number of bits transmitted per unit time without a corresponding reduction in the subjective quality of the transmitted intelligence. Various encoding techniques have been devised to increase the information content of the digital bits used to encode each sample of the analog signal. This is true of conventional PCM and of a variation referred to as differential pulse code modulation (DPCM) wherein only changes in amplitude and sign of the difference between successive samples of an analog signal are encoded instead of the total amplitude of each sample as is done in PCM.

Early prior art techniques for the encoding of successive samples of an analog signal utilized a fixed code group of digital bits to characterize each sample. The presence or absence of a pulse or digital bit of information at each specific location or time slot in the digital code group provides a particular combination that conveys the intelligence information which is usually indicative of one of several discrete steps known as the quantized amplitude of the sample. The number of time slots in a digital code group is a factor in determining the number of combinations or different quantized amplitude levels which the digital group can represent. Generally, a common procedure in conventional differential pulse code modulators is to assign one bit in each digital code group to represent the polarity or sign of each sample.

An improved differential encoding technique has been devised wherein actual polarity changes between samples are signaled by a prescribed digital group called a flag word to take advantage of the reduced number of polarity changes which only occur between approximately every fourth sample. Then only the absolute amplitude or magnitude of each sample is necessary to be encoded which reduces the overall number of digital bits required to encode the analog signal. The common disadvantage of all prior art techniques is that extra digital bits are required in the encoded signal to indicate sign information.

A primary object of this invention is to eliminate the conventional necessity of using extra digital bits to encode polarity or sign information of samples of an analog signal.

SUMMARY OF THE INVENTION

The invention in its various aspects overcomes the limitations of the prior art. Broadly, it avoids the necessity of utilizing extra digital bits to encode polarity or sign information by utilizing a predetermined digital bit to indicate both polarity and amplitude information. In some of its more specific aspects, the invention utilizes a signal processing arrangement wherein the error thereby inroduced into the encoding process is minimized.

In its broader aspects, the invention takes the form of a pulse code modulator for encoding a succession of regularly recurring signal amplitude samples of varying magnitude and polarity into code groups indicative of a predetermined number of quantum levels. Each sample is encoded into a code group of digital bits indicative of the magnitude of that sample. A predetermined bit which is indicative of the smallest change in magnitude in the code group is also forced to indicate the polarity of the sample. Specifically, when the sample to be encoded has one polarity, the bit is forced to be of one value, and when the sample to be encoded is of the opposite polarity, the bit is forced to be of another value. Since the change in value of the predetermined bit occurs in a more or less random fashion and the same is true of the change in the polarity of the encoded samples, there will be numerous occasions when the magnitude and polarity call for the same bit value or correlate. The dual function of the predetermined bit avoids the necessity of an extra bit to provide polarity information for the encoded signal samples.

In some additional and more specific aspects of the invention, when the predetermined bit indicative of the smallest change in magnitude of the code group does not call for the same bit as the polarity of the code group, a code group is produced which not only has the least significant message bit needed to indicate polarity, but also other selected bits are changed so that the magnitude represented by the entire code group is the magnitude level with the correct sign bit which most nearly indicates the actual level of the sample to be encoded. A specific sequence is used in transmitting the code groups wherein the predetermined bit of each code group serves to indicate the polarity of the immediately succeeding code group.

BRIEF DESCRIPTION OF THE DRAWING

Features of the invention and additional objects of the invention will be more readily appreciated and better understood by reference to the following detailed description which should be considered in conjunction with the drawing in which:

FIG. 2 is a chart which serves to illustrate a typical set of code groups and associated quantizing levels that may be used in the illustrative embodiment of the inventon.

DETAILED DESCRIPTION

Figure 1:
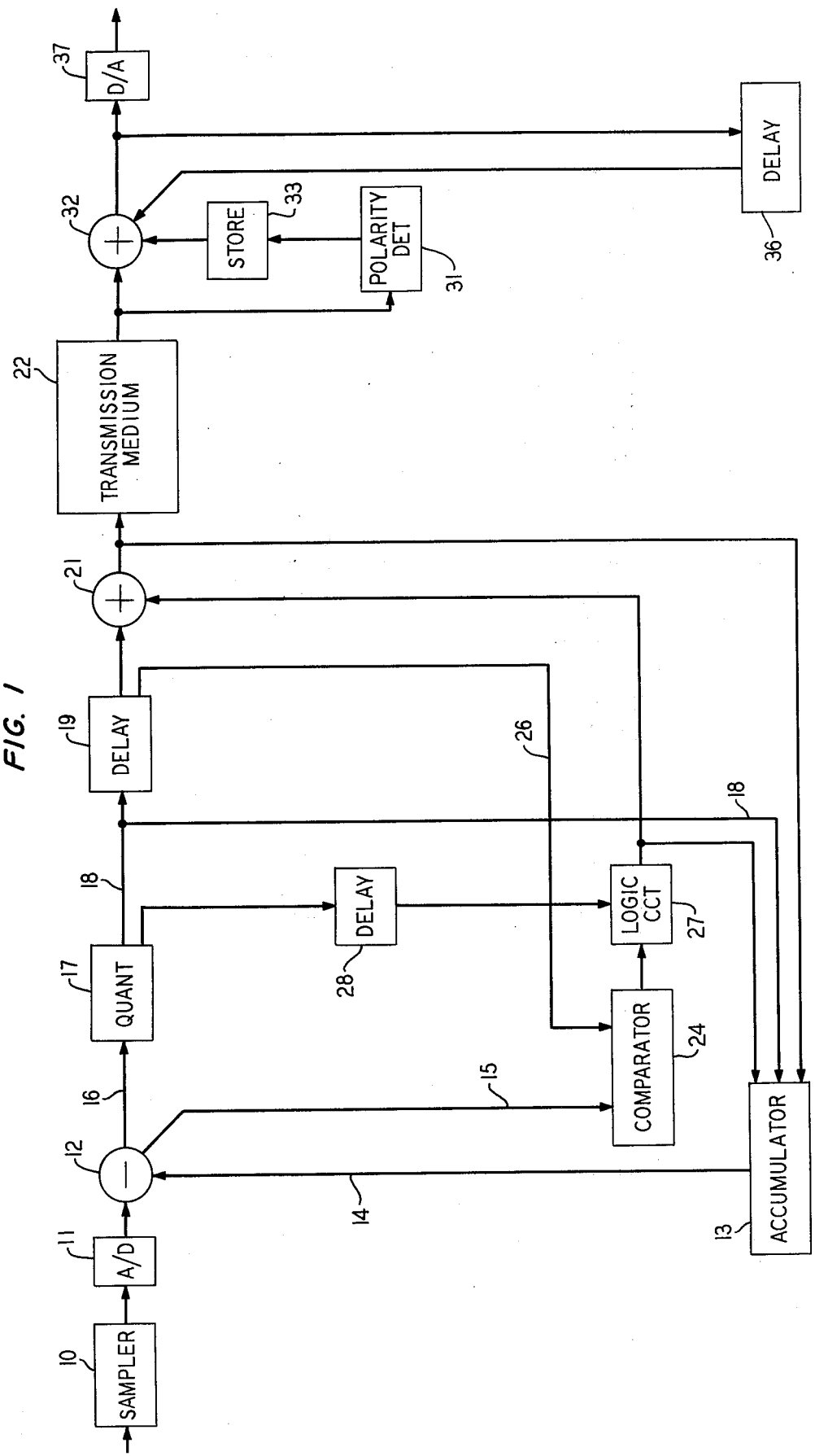
FIG. 1 is a block diagram of an illustrative embodiment of the invention.

FIG. 1 is a diagram of DPCM encoder in which an analog input signal, such as a video signal perhaps, is sampled by sampler 10 and the samples are applied to analog-to-digital (A/D) converter 11. A pulse code modulated digital signal is produced by converter 11 representative of the analog input signal. The pulse code modulated signal is applied to subtractor 12. It should be understood that sampler 10, A/D converter 11, and various other components of FIG. 1 all work together under the control of a source of synchronization signals not shown for the sake of simplicity. Subtractor 12 takes the difference between the output of A/D converter 11 and the output of accumulator 13 which will be discussed hereinafter. The output of converter 11 is a plurality of digital signals in code groups which may each comprise, for example, 8 bits wherein each group represents a pulse code modulated sample of the analog input signal. Subtractor 12 then produces an 8-bit differential signal without polarity or sign information on parallel rails represented by conductor 16. Quantizer 17 transforms the 8-bit signal into a 3-bit signal on conductor 18 which is supplied to delay 19. The operation of quantizer 17 may be viewed as a code conversion which may be realized by a conventional read-only memory that is appropriately programmed to provide the code words of FIG. 2 from the levels represented by the pulse code modulated output of converter 11. Delay 19 delays the code group for one sample period and supplies the signal to adder 21 which is transmitted through transmission medium 22. This signal path is the principal route in which the analog input signal is converted into a pulse code modulated signal and then a differential pulse code modulated signal for transmission.

Further explanation of the operation and circuitry in FIG. 1 can be more readily understood by reference to FIG. 2. The first vertical column of FIG. 2 lists the code groups which are produced at the output of quantizer 17 on three parallel rails represented by conductor 18. The second column in FIG. 2 lists the quantizing levels associated with each code group. It should be pointed out that the third bit or the bit to the extreme right in the code group alternates between "0" and "1" between adjacent quantizing levels. The third bit is indicative of the smallest change in quantum level which may also be termed the least significant message bit in the code groups. The third column in FIG. 2 illustrates additional levels associated with the fourth bit produced by quantizer 17. The additional levels may be selected to divide equally the level differences between the eight initial levels utilized by quantizer 17. The use of the fourth bit and associated seven intervening levels in the encoding process will become evident later in the discussion of the circuitry of FIG. 1.

Before further discussion it sould be pointed out that the set of 3-bit words produced by quantizer 17 and supplied to delay 19 originally represent only magnitude levels, that is, polarity or sign information produced at the output of subtractor 12 is not included at the input to delay 19. The polarity or sign information from the ouput of subtractor 12 is, however, supplied to comparator 24 via conductor 15. Subtractor 12 produces a 1 level output whenever the difference signal produced by subtractor 12 is positive and a 0 level output when the difference signal is negative. Conversely, a 1 may be selected to indicate a negative signal and a 0 may indicate a positive signal to provide the advantages of this invention provided the selection is consistent in both the coding and decoding operations. For present purposes, the description shall be consistent with the first selection following rather than the converse.

Comparator 24 receives the sign or polarity output of subtractor 12 and the output of delay 19 via conductor 26. The signal on conductor 26 may be either a 1 level or 0 level signal in accordance with the third bit in the coded output of quantizer 17. Comparator 24 produces an output to enable logic circuit 27 only when the levels of the two digital input signals applied thereto are not the same. When the two input levels for comparator 24 are the same, the coded signal produced by quantizer 17 has a polarity in accordance with the third bit in each code group. More specifically, the coincidence occurs whenever the bit is 0 and the polarity of the quantized level is negative or when the bit is 1 and there is a positive quantizing level.

When comparator 24 produces an output, logic circuit 27 is enabled and responds to the fourth bit contained in delay 28 which is produced in accordance with FIG. 2 as supplied by quantizer 17. Delay 28 delays the fourth bit for one sample period. Logic circuit 27 produces ouput signals which are supplied to adder 21 so that the output of delay 19 can be altered before transmission. Specifically, logic circuit 27 serves to change the third bit in each code group when indicated by comparator 24 so that the third bit will always give the correct polarity associated with each quantizing level. In the process of changing the third bit in each code group, logic circuit 27 utilizes the fourth bit output of quantizer 17 to determine if other bits in the code group should be changed to provide more accurate magnitude informaion. The fourth bit indicates whether the level initially quantized into one of the eight original levels is above or below the intervening level indicated by the fourth bit.

In FIG. 2, for example, if the original code group is a 010 and the actual polarity of the signal is positive instead of negative, the third bit of the code group would be changed from a 0 to 1. In the process of changing the third bit, the value of the fourth bit indicates if additional bit changes in each code group are necessary to produce a smaller error with respect to the magnitude level first indicated by the 3-bit code group. More specifically, if the fourth bit is a 1, the signal at th output of subtractor 12 has a value greater than a level of four and one-half but less than a level of six. Accordingly, a 001 code is added to the code group of 010 and it is changed to 011 to indicate the correct polarity and the most accurate level which includes the correct sign information. If the fourth bit is a 0, then a 001 code is added to the code group 010 using complementary addition producing a code group of 001 to indicate the most correct magnitude level. This example is one of a general process wherein the fourth bit is used which illustrates that the fourth bit provides an important feature which serves to increase the coding accuracy of the transmitted signal.

Logic circuit 27 may be realized by suitable memory circuitry which stores a code word of 001. When comparator 24 produces an output, the code word 001 is combined with the 3-bit code word out of delay 19 in adder 21. When the output of delay 28 is a 1 regular logic addition is used. When the output of delay 28 is a 0 the rules of complementary addition are employed which results in the subtraction of a 001 from the 3-bit code word out of delay 19.

Accumulator 13 receives the 3-bit digital code groups produced by quantizer 17 and sign information from adder 21, and also the output of logic circuit 27. Accumulator 13 maintains a summation of the previously encoded differences which are produced by quantizer 17. Since quantizer 17 only produces magnitude information, the third bit of the preceding code word out of adder 21 supplies the sign information. The output of logic circuit 27 as applied to accumulator 13 performs the same operation on the accumulated signal as that performed on the 3-bit signal in adder 21. Thus the accumulator 13 is corrected for changes that have been made in the transmitted 3-bit signal. It should, therefore, be understood that accumulator 13 maintains a summation which includes both polarity and magnitude information that is transmitted over transmission medium 22. The output of accumulator 13 is supplied to the other input of subtractor 12. This output of accumulator 13 is a digital signal in the same format at the output of converter 11 which is also supplied to subtractor 12. In this case, the output of accumulator 13 on conductor 14 is an 8-bit signal indicative of the accumulation of the previously transmitted difference signals so that subtractor 12 digitally subtracts each current sample produced by converter 11 from the accumulated signal maintained by accumulator 13.

Before a description of the receiving portion of the circuitry of FIG. 1, another phase in the operaion of the transmitting portion of FIG. 1 will be discussed. Specifically, this relates to the timing sequence of the relative occurrence of the predetermined bit designated to indicate the polarity of each sample magnitude represented by a code group. In operation the value of the third bit is designated to indicate the polarity of the immdiately succeeding magnitude sample. Each predetermined bit from the output of quantizer 17 is compared to the actual sign of the immediately succeeding sample as indicated by the sign output of subtractor 12 for comparator 24. If the sign output of subtractor 12 is different from the signal on conductor 26, the value of the predetermined bit is changed to indicate the polarity indicated by the sign ouput of subtractor 12. Since the polarity of the transmitted difference signal changes in a more or less random fashion and the third bit of each magnitude signal also varies in a similar manner, there will be numerous occasions when the third bit has the correct value to indicate the sign of the immediately succeeding difference signal to be transmitted. For these encoded samples, the information in delay 19 passes through adder 21 unaltered into transmission medium 22. When there is a disagreement between the sign indicated by the third bit of the preceding encoded magnitude on conductor 26 from delay 19 and the sign of the immediately succeeding sample which is indicated by sign output of subtractor 12, comparator 24 enables logic circuit 27 to initiate the correcting process in a manner which will produce the least amount of magnitude error. For these transmitted samples, the information in delay 19 is corrected in adder 21 before application to transmission medium 22.

In the initial situation in which the first transmitted sample is encoded, the transmitter and receiver circuitry of FIG. 1 assumes that the first code group has a positive polarity. In the case of encoded video signals, the first encoded sample of each video line, which immediately follows the horizontal synchronization signal, always has a positive polarity in the usual arrangement of video transmission. In other applications of the invention, it is to be understood that a different assumption or arrangement may be advantageously utilized.

In the receiving portion of FIG. 1, the signal from the transmission medium 22 is applied to polarity detector 31 and to signal combiner or algebraic adder 32. Except in the case of the first signal being transmitted, which is assumed to be positive, polarity detector 31 produces an output which is maintained in 1-bit store 33 in accordance with the third bit of each code group. Since the third bit of each code group indicates the polarity of the immediately succeeding signal, polarity detector 31 detects the value of the third bit of this code group and merely provides a polarity signal for store 33 in advance of its associated code group. Adder 32 responds to the polarity signal by either adding or subtracting each signal to the other input applied thereto. If the third bit indicates that the sign of the immediately succeeding code group represents a positive value, adder 32 adds the transmitted magnitude to the output of delay 36. Conversely, if the third bit indicates a negative value, adder 32 subtracts the transmitted signal from the output of delay 36. At all times, the output of delay 36 which is applied to adder 32 is a summation of the previously transmitted code groups delayed one sample period which contain both magnitude and sign information. The output of adder 32 applied to delay 36 is the updated version of the current signal. Digital-to-analog converter 37 is also connected to the output of adder 32 so that it can produce an analog signal which is a replica of the analog input signal applied to converter 11. Accordingly, the output of converter 37 reproduces the input signal applied to converter 11.

Wha is claimed is:

1. A pulse code modulator for encoding a succession of regularly recurring samples having varying magnitude and polarity into code groups indicative of a prescribed number of quantum levels comprising:
   means for encoding the magnitude of each sample into one of the code groups comprising a plurality of bits indicative of the quantum level corresponding to that magnitude, and
   means for forcing a predetermined bit in each of said code groups indicative of the smallest change in quantum level in each of said code groups to have one value when an encoded sample has one polarity and to have another value when an encoded sample has the opposite polarity so that the predetermined bit indicates the polarity of each code group whereby the information content of the output of said means for forcing is increased so as to avoid the use of extra digital bits solely to indicate polarity.

2. The pulse code modulator of claim 1 wherein said means for encoding produces an additional bit indicative of the magnitude of each of said regularly recurring pulses between said prescribed number of quantum levels and said means for forcing is responsive to said additional bit and changes the values of other bits in each of said code groups when the change will provide a code group with the correct polarity and a more accurate magnitude than the code group would otherwise have by changing the predetermined bit alone.

3. The pulse code modulator of claim 2 wherein said means for forcing comprises means for temporarily storing each code group and means for indicating the polarity of each of said recurring pulses to provide an output indicative of polarity, and means for comparing the predetermined bit in each code group to the output of said means for indicating to force the change in value of the predetermined bit.

4. The pulse code modulator of claim 3 further comprises accumulating means for providing a summation of the code groups produced by said means for forcing and wherein said means for encoding comprises converting means for producing a pulse coded version of said regularly recurring pulses and subtracting means for obtaining the difference between said summation and said pulse coded version and quantizing means connected to the output of said subtracting means for producing said code groups indicative of a prescribed number of quantum levels.

5. A pulse code modulator comprising:

a source of digital signals in code groups wherein a predetermined bit indicative of the smallest change in quantum level indicates the polarity of the immediately succeeding code group;

means for detecting the value of the predetermined bit for providing an output signal indicative of polarity;

means for storing the output signal; and converting means responsive to the contents of said means for storing and the code groups for providing an analog signal acording to the information indicated by said source of digital signals.

6. The pulse code modulator of claim 5 wherein said converting means comprises:

combining means responsive to said means for storing and the code groups from said source;

accumulating means responsive to the output of said combining means and supplying an output signal indicative of an accumulation of prior code groups, said combining means algebraically combining each code group from said source and the output of said accumulating means wherein each code group is subtracted from the output of said accumulating means when said means for storing indicates a negative quantity and said combining means adds each code group to the output of said accumulating means when said means for storing indicates a positive quantity, and digital-to-analog converting means connected to the output of said combining means for providing said analog signal.

* * * * *